(12) United States Patent
Chien et al.

(10) Patent No.: US 6,846,748 B2
(45) Date of Patent: Jan. 25, 2005

(54) METHOD FOR REMOVING PHOTORESIST

(75) Inventors: Wen-Sheng Chien, Hsinchu (TW); Yen-Wu Hsieh, Taoyuan Hsien (TW)

(73) Assignee: United Microeletronics Corp., Hsinchu (TW)

( * ) Notice: Subject to any disclaimer, the term of this patent is extended or adjusted under 35 U.S.C. 154(b) by 0 days.

(21) Appl. No.: 10/428,508

(22) Filed: May 1, 2003

(65) Prior Publication Data
US 2004/0219792 A1 Nov. 4, 2004

(51) Int. Cl.[7] ............................................. H01L 21/302
(52) U.S. Cl. ........................ 438/709; 438/689; 438/695
(58) Field of Search ................................ 438/725, 704, 438/709

(56) References Cited

U.S. PATENT DOCUMENTS

| | | | | |
|---|---|---|---|---|
| 4,699,689 A | * | 10/1987 | Bersin | ........................ 438/709 |
| 5,681,487 A | * | 10/1997 | Seki et al. | ..................... 216/94 |
| 5,989,997 A | * | 11/1999 | Lin et al. | ..................... 438/622 |
| 6,242,350 B1 | * | 6/2001 | Tao et al. | ..................... 438/690 |
| 6,281,135 B1 | * | 8/2001 | Han et al. | ..................... 438/725 |
| 6,291,142 B1 | * | 9/2001 | Tanabe et al. | ............. 430/331 |
| 6,319,809 B1 | * | 11/2001 | Chang et al. | ............... 438/597 |
| 6,365,529 B1 | * | 4/2002 | Hussein et al. | ............. 438/780 |
| 6,410,417 B1 | * | 6/2002 | Tsai et al. | ..................... 438/618 |

OTHER PUBLICATIONS

S.Wolf & R.N. Tauber, "Silicon Processing for the VLSI Era", vol. 1, Lattice Press, 1995, pp. 439–442.*

* cited by examiner

Primary Examiner—David Nelms
Assistant Examiner—Thao P. Le
(74) Attorney, Agent, or Firm—J.C. Patents

(57) ABSTRACT

A method for removing photoresist is described. A substrate having a photoresist to be removed thereon is provided, and then an ashing process is performed to remove most of the photoresist. The substrate is irradiated with UV light, and the remaining photoresist and polymer are stripped with stripping solvents after UV irradiation.

20 Claims, 3 Drawing Sheets

METHOD FOR REMOVING PHOTORESIST

BACKGROUND OF THE INVENTION

1. Field of Invention

The present invention relates to a semiconductor process. More particularly, the present invention relates to a method for removing photoresist after a lithographic process.

2. Description of Related Art

In a semiconductor process, lithographic processes are frequently conducted to define photoresist patterns on a wafer, while the photoresist patterns serve as etching or implantation masks for subsequent patterning or implantation process. After the patterning or implantation process, the photoresist remaining on the wafer is usually removed with plasma ashing followed by solvent stripping. The plasma ashing step removes most of the photoresist with $O_2$-based plasma, and the solvent stripping step completely removes the remaining photoresist and polymer with one or more solvents.

As the underlying substrate includes a metal layer, especially a titanium (Ti) layer, however, the metal layer is charged by the ashing plasma and therefore may be attacked by the stripping solvents because of the well-known galvanic cell effect. For example, FIG. 4 shows a TEM (Tunneling Electron Microscope) picture of an interconnect structure that has experienced the photoresist removal process of the prior art (plasma ashing+solvent stripping). The interconnect structure includes a tungsten via plug 402, a Ti/TiN barrier layer 404 consisting of a titanium layer 406 and a titanium nitride (TiN) layer 408, and an aluminum line 410. The titanium layer 406 is shown white as having been attacked by stripping solvents, while a normal titanium film should be black in such a TEM picture. The attacked titanium layer 406 causes a higher contact resistance between the tungsten via plug 402 and the aluminum line 410, so the performance of the manufactured semiconductor device is lowered because of RC delay effect.

SUMMARY OF THE INVENTION

Accordingly, this invention provides a method for removing photoresist to avoid a conductive layer under the photoresist from being charged and attacked by stripping solvents.

This invention also provides a method for forming a patterned conductive layer that utilizes the photoresist removal method of this invention.

This invention further provides a method for forming a via hole that also utilizes the photoresist removal method of this invention.

The method for removing photoresist of this invention is described below. A substrate having a photoresist and polymer thereon is provided, wherein the polymer is an etch by-product that is formed during a previous etching step that uses the photoresist as an etching mask. Then, an ashing process is performed to remove most of the photoresist. The substrate is then irradiated with UV light, and the remaining photoresist and polymer are stripped with a solvent. The photoresist may define a conductive layer on the substrate, or define a via hole in a dielectric layer that exposes a conductive layer.

The method for forming a patterned conductive layer of this invention is described below. A substrate having a conductive layer and a patterned photoresist layer thereon is provided. The conductive layer includes a metal layer that is easily attacked by stripping solvents because of galvanic cell effect, such as a titanium layer. The conductive layer is then patterned with the patterned photoresist layer as a mask, wherein polymer is formed as an etch by-product. Then, an ashing process is conducted to remove most of the photoresist layer. The substrate is irradiated with UV light, and then the remaining photoresist layer and polymer are stripped with a solvent.

The method for forming a via hole of this invention is described below. A substrate having a conductive layer, a dielectric layer and a patterned photoresist layer thereon is provided, wherein the patterned photoresist layer is on the dielectric layer. The conductive layer includes a metal layer that is easily attacked by stripping solvents because of galvanic cell effect, such as a titanium layer. The dielectric layer is patterned using the patterned photoresist layer as a mask to form a via hole that exposes the conductive layer, wherein polymer is formed in the via hole as an etch by-product. An ashing process is performed to remove most of the photoresist layer. The substrate is irradiated with UV light, and then the remaining photoresist layer and polymer are stripped with solvents.

In this invention, the UV irradiation after the plasma ashing process is capable of preventing a galvanic cell effect from being induced on the conductive layer under the photoresist, so the conductive layer can be protected from the attack of the stripping solvents.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

First Embodiment

Figure 1A:
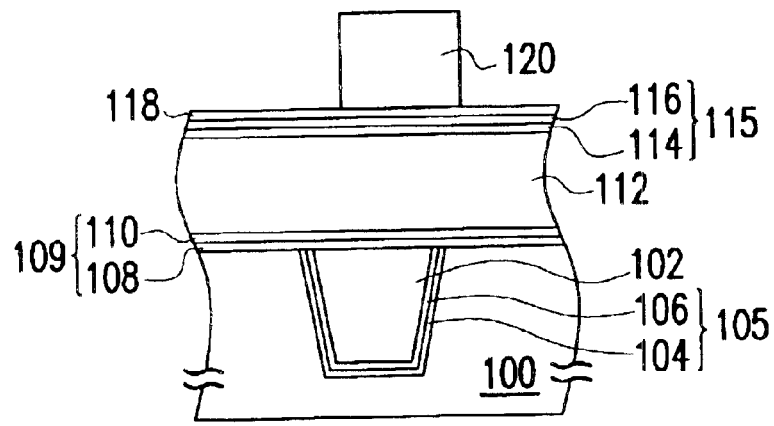
FIGS. 1A-1C illustrate a method for forming a patterned conductive layer and the accompanying photoresist removal step according to a first embodiment of this invention.
Figure 1B:
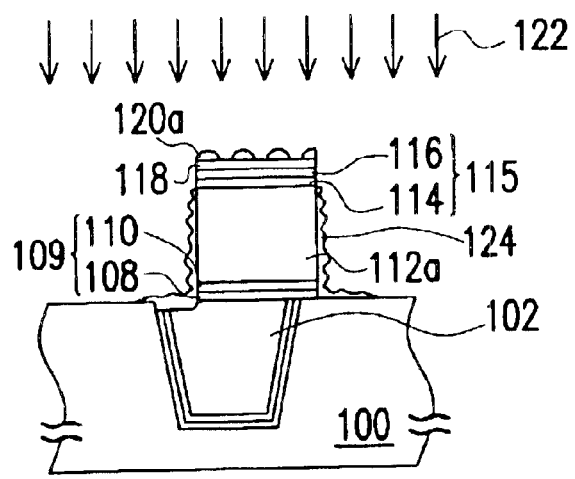
Figure 1C:
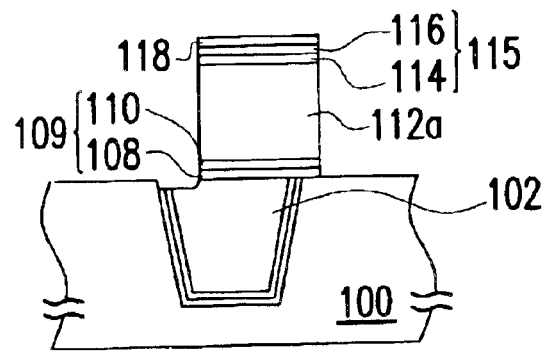

FIGS. 1A-1C illustrate a method for forming a patterned conductive layer and the accompanying photoresist removal step according to the first embodiment of this invention.

Referring to FIG. 1A, a substrate 100 having a metal plug 102 therein is provided. A titanium layer 104 and a titanium nitride (TiN) layer 106, which two serve as a diffusion barrier layer 105 together, are disposed-between the substrate 100 and the metal plug 102. The metal plug 102 comprises a material such as tungsten (W). Another diffusion barrier layer 109, a metal layer 112, a conductive anti-reflection coating (ARC) 115, a SiON/SiO composite layer 118 as a dielectric anti-reflection coating (DARC), and a patterned photoresist layer 120 are sequentially formed on the substrate 100. The diffusion barrier layer 109 includes, for example, a titanium layer 108 and a TiN layer 110. The metal layer 112 comprises a highly diffusive metal such as aluminum (Al). The conductive anti-reflection coating (ARC) 115 includes, for example, a titanium layer 114 and a TiN layer 116. The photoresist layer 120 may comprise a positive or negative photoresist material.

Referring to FIGS. 1A-1B, an anisotropic etching process is conducted using the patterned photoresist layer 120 as a mask to pattern the SiON/SiO composite layer 118, the conductive anti-reflection coating (ARC) 115, the metal layer 112 and the diffusion barrier layer 109. The metal layer 112 is patterned into a metal pattern 112a, such as a metal line. In addition, an etch by-product of the anisotropic etching process, polymer 124, is formed on the sidewalls of the metal pattern 112a and on the surface of the substrate 100. After a plasma ashing process is performed to remove most of the photoresist layer 120, the substrate 100 and all layers thereon are irradiated with LW light 122. The wavelength of the UV light 122 is larger than 250 nm, and is preferably from 280 nm to 330 nm.

Referring to FIGS. 1B and 1C, the remaining photoresist 120a and the polymer 124 are stripped from the SiON/SiO composite layer 118 with stripping solvents. The stripping solvents include, for example, hydroxyl amine (HA), catechol and monoethanolamine. With the UV irradiation, a galvanic cell effect is not induced on the two titanium layers 108 and 114 in the photoresist stripping treatment. Therefore, the two titanium layers 108 and 114 can be prevented from being attacked by the stripping solvents.

Second Embodiment

Figure 2A:
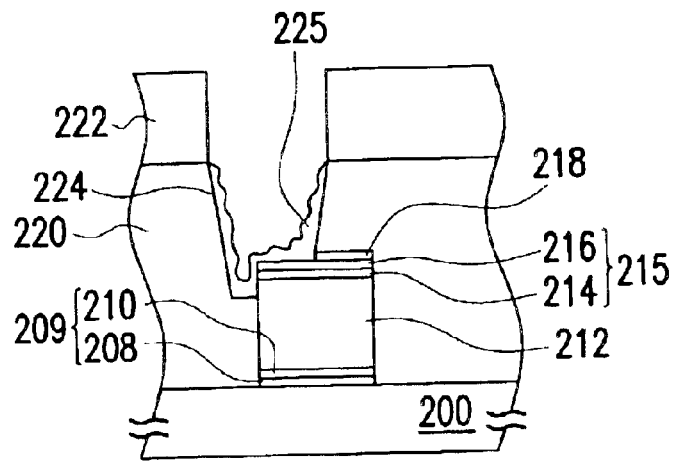
FIGS. 2A-2C illustrate a method for forming a via hole and the accompanying photoresist removal step according to a second embodiment of this invention.
Figure 2B:
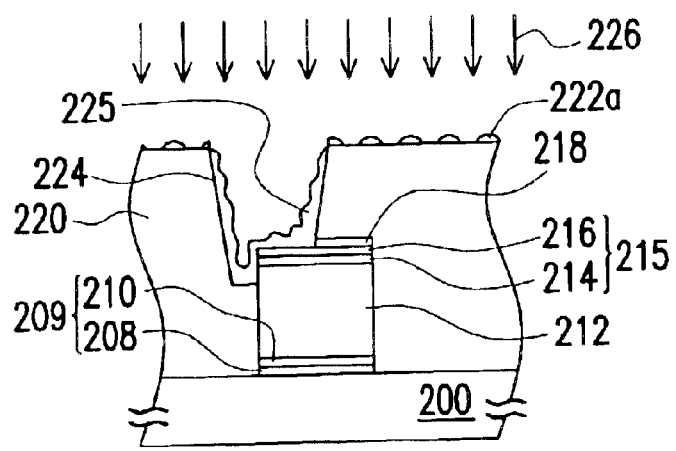
Figure 2C:
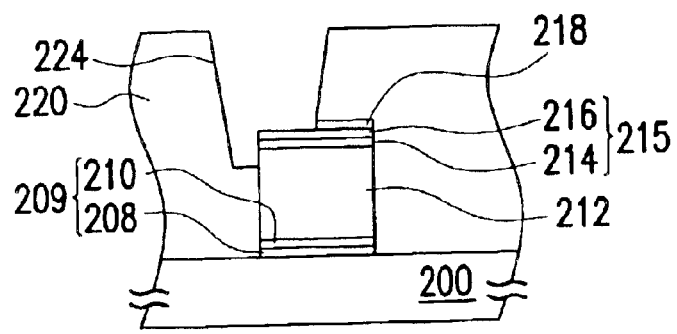

FIGS. 2A-2C illustrate a method for forming a via hole and the accompanying photoresist removal step according to the second preferred embodiment of this invention.

Referring to FIG. 2A, a substrate 200 having a metal layer 212 and a dielectric layer 220 thereon is provided. A diffusion barrier layer 209 is disposed between the substrate 200 and the metal layer 212, and a conductive anti-reflection coating (ARC) 215 and a SiON/SiO composite layer 218 as a dielectric anti-reflection coating (DARC) are formed on the metal layer 212. The dielectric layer 220 covers the metal layer 212 and the SiON/SiO composite layer 218. A patterned photoresist layer 222 is formed on the dielectric layer 220, and then an anisotropic etching process is performed to define a via hole 224 in the dielectric 220 that exposes the conductive anti-reflection coating (ARC) 215. During the anisotropic etching process, polymer 225 is formed in the via hole 224 as an etch by-product.

Referring to FIG. 2B, after a plasma ashing process is performed to remove most of the photoresist layer 222, the substrate 200 and all layers thereon are irradiated with UV light 226. The wavelength of the UV light 226 is larger than 25 nm, and preferably from 280 nm to 330 nm.

Referring to FIGS. 2B and 2C, the remaining photoresist 222a and the polymer 225 are stripped from the dielectric layer 220 with stripping solvents. The solvents include, for example, hydroxyl amine (HA), catechol and monoethanolamine. With the UV irradiation, a galvanic cell effect is not induced on the titanium layer 214 in the photoresist stripping treatment. Therefore, the titanium layers 214 can be prevented from being attacked by the stripping solvents.

Figure 3:
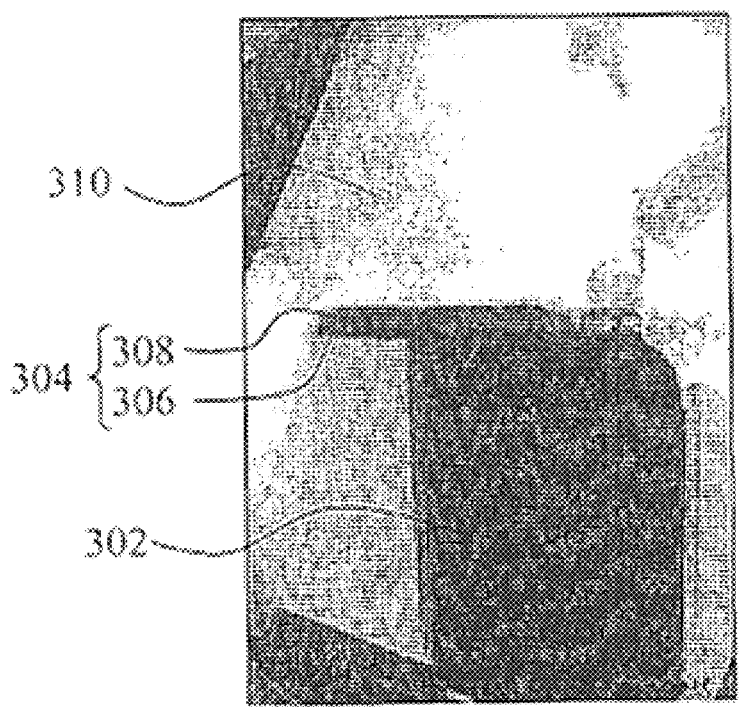
FIG. 3 shows a TEM picture of an interconnect structure that has experienced a photoresist removal process of this invention, wherein the interconnect structure includes a titanium barrier layer.

FIG. 3 shows a TEM picture of an interconnect structure that has experienced a photoresist removal process of this invention, wherein the interconnect structure includes a titanium barrier layer.

Figure 4:
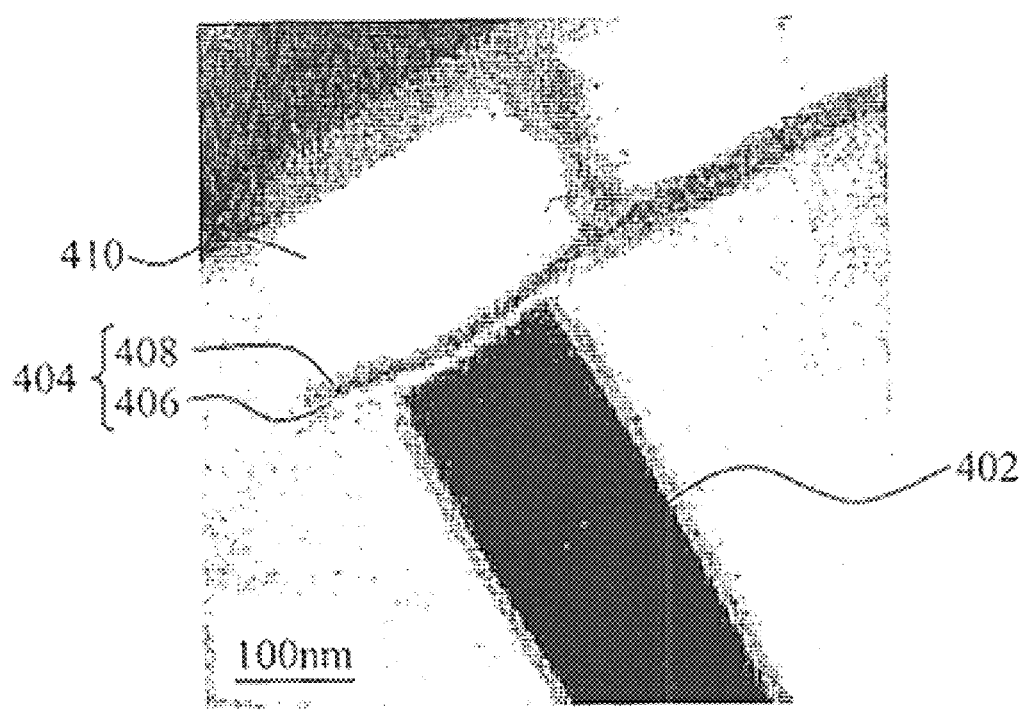
FIG. 4 shows a TEM picture of an interconnect structure that has experienced a photoresist removal process of the prior art, wherein the interconnect structure includes a titanium barrier layer.

Referring to FIG. 3, the interconnect structure includes a tungsten via plug 302, a Ti/TiN barrier layer 304 consisting of a titanium layer 306 and a TiN layer 308, and an aluminum line 310. The titanium layer 306 is shown black in FIG. 3, which means that the titanium layer 306 is not attacked by the stripping solvent. On the contrary, the titanium layer 406 having experienced the photoresist removal process of the prior art is shown white in FIG. 4 as having been attacked by stripping solvents.

According to the embodiments of this invention, the titanium layers on the substrate are not attacked by the stripping solvents due to the UV irradiation. Consequently, the resistance of the titanium layer or the interconnect structure is not raised, and the performance of the manufactured semiconductor device is not lowered.

Though the titanium layer to be protected serves either as a diffusion barrier layer or as an anti-reflection coating (ARC) in the above embodiments of this invention, the titanium layer may also be formed for other purposes. That is, this invention can be applied to protect a titanium layer in any arbitrary case where a titanium layer is exposed after a patterning process.

Furthermore, the invention is not only restricted to apply to the case where a titanium layer is to be protected from the attack of stripping solvents, but also can be applied to the cases that use other electrically conductive materials easily attacked by stripping solvents in a charged state. For example, this invention can be used to protect an exposed tungsten layer if the photoresist stripping step uses some solvents having stronger oxidation ability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for removing a photoresist, comprising:
providing a substrate having a photoresist and polymer thereon, wherein the polymer is an etch by-product;
performing an ashing process that uses a plasma containing charged species to remove most of the photoresist;
irradiating the substrate with UV light after the ashing process; and
stripping remaining photoresist and the polymer with a solvent.

2. The method of claim 1, wherein the photoresist defines a conductive layer on the substrate.

3. The method of claim 2, wherein the conductive layer includes a titanium layer.

4. The method of claim 2, wherein the conductive layer includes a diffusion barrier layer and a metal layer on the diffusion barrier layer.

5. The method of claim 4, wherein the diffusion barrier layer includes a titanium layer.

6. The method of claim 2, wherein the conductive layer includes a metal layer and an anti-reflection coating on the metal layer.

7. The method of claim 6, wherein the anti-reflection coating includes a titanium layer.

8. The method of claim 1, wherein the photoresist defines an opening in the substrate that exposes a conductive layer.

9. The method of claim 8, wherein the conductive layer includes a metal layer and an anti-reflection coating on the metal layer.

10. The method of claim 9, wherein the anti-reflection coating includes a titanium layer.

11. The method of claim 1, wherein a wavelength of the UV light ranges from 280–330 nm.

12. The method of claim 1, wherein the solvent comprises hydroxyl amine (HA), catechol and monoethanolamine.

13. A method for forming a patterned conductive layer, comprising:

proviidng a substrate having a conductive layer and a patterned photoresist layer thereon, wherein the patterned photoresist layer is on the conductive layer;

patterning the conductive layer with the patterned photoresist layer as a mask, wherein polymer is formed as an etch by-product;

performing an ashing process that uses a plasma containing charged species to remove most of the photoresist layer;

irradiating the substrate with UV light after the ashing process; and stripping remaining photoresist layer and the polymer with a solvent.

14. The method of claim 13, wherein the conductive layer includes a diffusion barrier layer and a metal layer on the diffusion barrier layer.

15. The method of claim 14, wherein the diffusion barrier layer includes a titanium layer.

16. The method of claim 13, wherein the conductive layer includes a metal layer and an anti-reflection coating on the metal layer.

17. The method of claim 16, wherein the anti-reflection coating includes a titanium layer.

18. A method for forming a via hole, comprising:

providing a substrate having a conductive layer, a dielectric layer and a patterned photoresist layer thereon, wherein the patterned photoresist layer is on the dielectric layer;

patterning the dielectric layer using the patterned photoresist layer as a mask to form a via hole that exposes the conductive layer, wherein polymer is formed in the via hole as an etch by-product;

performing an ashing process that uses a plasma containing charged species to remove most of the photoresist layer;

irradiating the substrate with UV light after the ashing process; and stripping remaining photoresist layer and the polymer with a solvent.

19. The method of claim 18, wherein the conductive layer includes a metal layer and an anti-reflection coating on the metal layer.

20. The method of claim 19, wherein the anti-reflection coating comprises a titanium layer.

* * * * *